United States Patent [19]

Hsiao

[11] 3,904,988

[45] Sept. 9, 1975

[54] CMOS VOLTAGE CONTROLLED OSCILLATOR

[75] Inventor: Perng Hsiao, Tempe, Ariz.

[73] Assignee: Motorola, Inc., Chicago, Ill.

[22] Filed: Sept. 11, 1974

[21] Appl. No.: 505,194

[52] U.S. Cl. ............................ 331/111; 331/108 C

[51] Int. Cl.$^2$ .......................................... H03K 4/50

[58] Field of Search ........... 331/108 C, 108 D, 111, 331/143; 332/31 T

[56] References Cited

UNITED STATES PATENTS

| | | | |
|---|---|---|---|
| 3,593,198 | 7/1971 | Karcher et al. | 331/111 |
| 3,702,446 | 11/1972 | Steudel | 331/108 D |
| 3,708,757 | 1/1973 | Savarese et al. | 331/108 D |
| 3,736,528 | 5/1973 | Acker et al. | 331/108 D |
| 3,742,384 | 6/1973 | Breitzmann et al. | 331/108 D |
| 3,831,113 | 8/1974 | Ahmed | 331/111 |
| 3,870,971 | 3/1975 | Takahashi et al. | 331/111 |

*Primary Examiner*—John Kominski
*Attorney, Agent, or Firm*—Vincent J. Rauner; Charles R. Hoffman

[57] ABSTRACT

A CMOS voltage controlled oscillator is described. This CMOS voltage controlled oscillator is a linear CMOS circuit and exhibits an infinite current gain, a near infinite input impedance, a very high voltage gain with a corresponding low power consumption. Additionally, the oscillator is capable of operating over a wide range of DC supply voltages. Because the circuit is of CMOS design its complexity is much less than corresponding circuits made using bipolar devices or field effect transistors.

This CMOS voltage controlled oscillator comprises a complementary current source generator for providing a current source as a charging current and a current sink as a discharging current of equal magnitude for the timing capacitor of the circuit. This charging and discharging current are each linearly proportional to the input controlling voltage. A high speed voltage comparator is responsive to the voltage of the timing capacitor and the voltage from an hysteresis feedback circuit for providing fast acting driving voltage for the output stage. A linear amplifier output stage is responsive to the high speed voltage comparator for providing ultra-fast changing signals for wave shaping purposes. An hysteresis feedback loop responsive to the output stage and connected as one input to the voltage comparator provides two threshold states for the voltage comparator.

4 Claims, 11 Drawing Figures

CMOS VOLTAGE CONTROLLED OSCILLATOR

BACKGROUND OF THE INVENTION

The prior art shows that the complementary metal-oxide-silicon field effect transistor (CMOS) has been used extensively in digital circuits and has exhibited the advantages of low power consumption, high input impedance, high noise immunity, and a capability of operating from a wide range of power supply voltages.

There is no prior art teaching the design of a voltage controlled oscillator operating with the characteristics of linear CMOS. The prior art of CMOS voltage control oscillators (VCO) shows very complex logic circuits for generating squarewaves and a simple MOSFET voltage controlled current source for variable frequency control which does not yield the linearity, the wide controlled frequency range, and the accuracy as the present invention.

SUMMARY OF THE INVENTION

The present invention relates to integrated circuits and, more particularly, to a CMOS voltage controlled oscillator which utilizes complementary metal-oxide-silicon field effect transistors of the enhancement type and employs either a metal gate configuration or a silicon gate configuration.

An object of the present invention is to provide a voltage control to the square waved oscillator in which the frequency of oscillation is linearly proportional to the input controlling voltage.

A further object of the present invention is to provide a voltage controlled oscillator which is capable of operating over a wide range of DC supply voltages at low DC current drains.

A still further object of the present invention is to provide a voltage controlled oscillator in which the oscillating frequency is independent of the CMOS device parameters.

Another object of the present invention is to provide a voltage controlled oscillator in which all the components are suitable for manufacture using standard CMOS monolithic integration processes.

A still further object of the present invention is to provide a voltage controlled oscillator in which the amplitude of the output signal is constant for all frequencies.

Another object of the present invention is to provide a voltage controlled oscillator which is capable of producing complementary squarewave output signals.

A further object of the present invention is to provide a voltage controlled oscillator with an extremely high input impedance.

A still further object of the present invention is to provide a voltage controlled oscillator which is capable of controlling oscillating frequencies over a decade range, with good linearities, and without any adjustment of components and the overall frequency capabilities being well over seven decades.

These and other objects and features of this invention will become fully apparent in the following description of the accompanying drawings, wherein:

BRIEF DESCRIPTION OF THE INVENTION

The present invention employs linear CMOS circuits as the building blocks for a wide range, linear, precision voltage controlled oscillator (VCO). This voltage controlled oscillator employs a voltage controlled complementary current generator which generates a current source as a charging current to the timing capacitor and employs a current sink as the discharging current of equal magnitude for the timing capacitor. Both the charging current and the discharging current are linearly proportional to the input signal voltage and are of equal but opposite magnitude. A switching circuit is intermediate the complementary current source generator and the timing capacitor and is controlled by the output signal of the voltage controlled oscillator, for achieving the clean switching output signal. A voltage comparator switches states whenever the voltage across the timing capacitor is larger than the high threshold voltage of the comparator, or is less than the low threshold voltage of the comparator. The output from the comparator triggers the switching of the output voltage state, the threshold voltage level of the comparator, and the state of the capacitor between charge and discharge. Since the charging current for the capacitor and the discharging current from the capacitor are identical a squarewave output is guaranteed. A high gain amplifier is employed to feed the wave shaping output inverter for reducing the switching time from the high output state to the low output state and vice versa. A bias coupler is positioned intermediate the differential amplifier circuit and the high gain amplifier for biasing the high gain amplifier at the optimum position intermediate the linear range of the high gain amplifier output circuit. A feedback circuit is positioned intermediate both sides of one of the output inverters and the inverting input to the voltage comparator for generating two threshold states for the voltage comparator. The voltage comparator switches states responsive to the input signal from the hysteresis feedback circuit and the charge on the timing capacitor.

The CMOS voltage control oscillator is compatible with digital CMOS circuits and enhances the versatility of the CMOS application not only to make digital and analog circuits but also to make a combination of the two.

DETAILED DESCRIPTION OF THE INVENTION

Throughout the several Figures, the same numeral is used to identify the same components.

Figure 1:
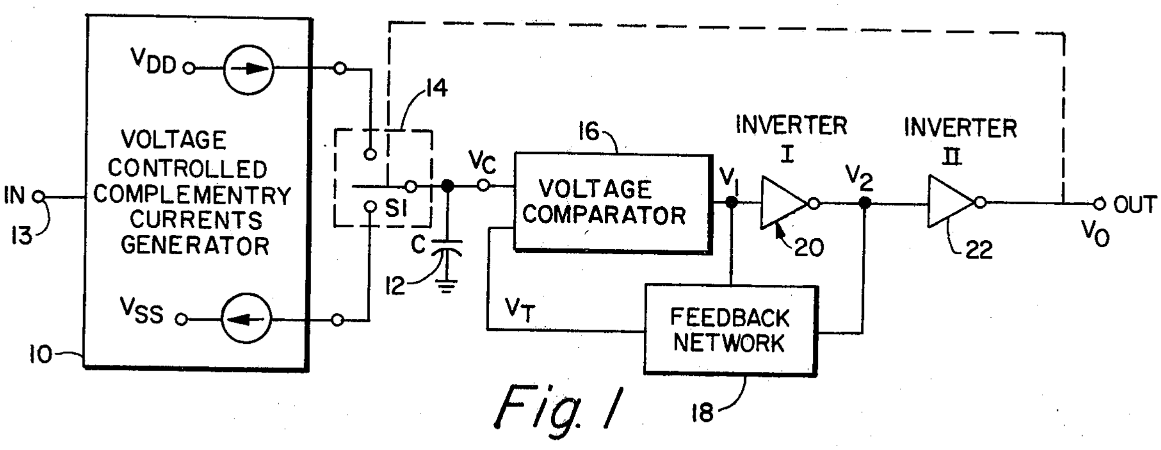
FIG. 1 shows a block diagram of a CMOS voltage controlled oscillator.

Referring to FIG. 1, there can be seen a block diagram of the present invention. The major components of the voltage controlled oscillator comprised a voltage controlled complementary current generator 10 for providing a current source and a current sink for charging and discharging, respectively, the timing capacitor shown at 12. A requirement of the voltage controlled complementary current generator 10 is that the charging current be of equal magnitude but of opposite direction from the discharging current, and that both currents be linearly proportional to the input controlling voltage. In other words, when the voltage at the input terminal 13 is changed, the magnitudes of the charging and discharging current changes linearly with respect thereto. The timing capacitor 12 is responsive to the current generator 10 for receiving a charging current from the current generator or to provide a discharging current to the current generator as controlled by a switch 14. The switch 14 is controlled by the output signal of the voltage controlled oscillator and provides a charging path for the capacitor or a discharging path for the capacitor through the generator 10. A high speed voltage comparator 16 is responsive to the voltage signal on the timing capacitor 12 and the voltage from a feedback network 18 for generating threshold levels of two polarities for controlling the sharpness of the output signal at the output terminal 20. A plurality of inverter stages 20 and 22 provide the wave shaping characteristics for the system. The feedback network 18 is responsive to the voltage at either end of the inverter 20. Accordingly, the voltage at a node $V_1$ is of opposite polarity to the voltage at a node $V_2$. The feedback network translates these voltages to a control voltage to the voltage comparator for controlling the charging and discharging of the timing capacitor 12. The feedback network generates a high threshold state control voltage and a low threshold state control voltage.

Figure 2A:
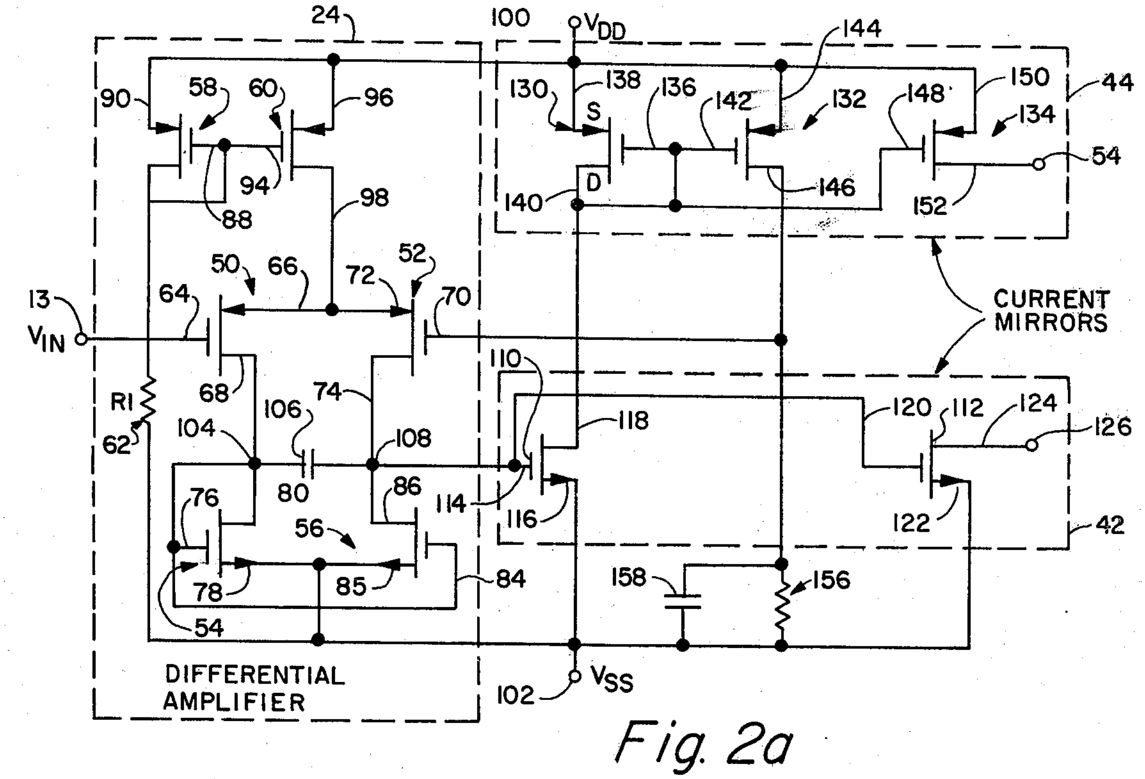
FIG. 2*a* is a circuit diagram of a voltage controlled complementary current source generator.
Figure 2B:
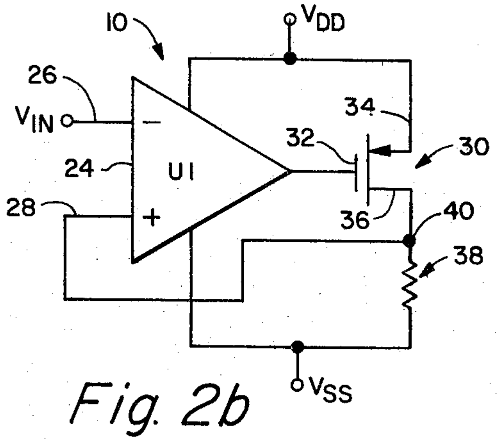
FIG. 2*b* is a block diagram of a voltage controlled current generator.

In referring to FIG. 2*b*, there is shown a simplified block diagram of the voltage controlled complementary current generator 10. The current generator 10 operates from two power supply levels; $V_{DD}$ which is the positive power supply level and $V_{SS}$ which is the negative power supply level. A triangle indicated by the numeral 24 represents a differential amplifier connected between the $V_{DD}$ terminal and the $V_{SS}$ terminal. A first input voltage is available on the $V_{IN}$ line 26 while an internally generated voltage is available on the feedback line indicated at 28. The output of the differential amplifier is applied to a transistor 30. The transistor 30 is provided with gate, source and drain terminals, 32, 34, and 36, respectively. The source terminal 34 is connected to the $V_{DD}$ terminal while the drain terminal is connected to the $V_{SS}$ terminal by way of a load resistor 38. The junction 40 of the drain terminal 36 and the resistor 38 is connected as the second input or the noninverting input 28 to the differential amplifier. In operation, if the input voltage on line 26 is equal to the internally generated voltage on line 28, then because of the balance character of the differential amplifier stage the differential amplifier is in equilibrium and no discernible output signal is available at the gate 32 of transistor 30. In the event that the voltage at the terminal 26 decreases, the output signal of the amplifier goes high and causes transistor 30 to conduct more heavily, thereby generating a high voltage signal at junction 40. This voltage at junction 40 is fed back by way of line 28 to the differential amplifier 24 causing it to return to its equilibrium condition. In the event that the voltage at the terminal 26 increases, the output signal of the amplifier goes low and causes transistor 30 to conduct less, thereby generating a low voltage signal at junction 40. This voltage at junction 40 is fed back by way of line 28 to the differential amplifier 24 causing it to return to its equilibrium condition.

Referring to FIG. 2*a*, there is shown the detailed schematic of the differential amplifier 24 as well as the two current mirrors indicated generally at 42 and 44 used in the complementary current source generator 10.

The input stage to the differential amplifier 24 comprises a pair of transistors 50 and 52. The load transistors for the input transistors are the transistors 54 and 56, respectively. The bias network for the differential amplifier comprises a pair of transistors 58 and 60 and a resistor 62. The transistor 50 has gate, source and drain electrodes indicated by numerals 64, 66 and 68, respectively. The transistor 52 has gate, source and drain electrodes indicated by numerals 70, 72 and 74, respectively. The transistor 54 has gate, source and drain electrodes as shown at gate 76, 78 and 80, respectively. Transistor 56 has gate, source and drain electrodes at 82, 84 and 86, respectively. Transistor 58 has gate, source and drain electrodes at 88, 90 and 92, respectively. Transistor 60 has gate, source and drain electrodes at 94, 96 and 98, respectively. The voltage input terminal is connected to the gate electrode 64 of the transistor 50. The source electrodes 66 and 72 of the input transistors 50 and 52 are connected together with the drain electrode 98 of the current mirror transistor 60. The source electrode of the transistor 60 is connected to the positive power supply as indicated at the terminal 100. The gate electrode 94 of the transistor 60 is connected to the gate electrode 88 and to the drain electrode 92 of the transistor 58. The source electrode 90 of the transistor 58 is connected to the positive voltage supply at terminal 100. The drain electrode 92 of the transistor 58 is connected to one end of the resistor 62 while the second end of the resistor 62 is connected to the negative power supply indicated at the terminal 102.

The source electrode 68 of the input transistor 50 is connected to a common point 104 which is connected to the gate electrode 76 of the transistor 54 and to the drain electrode 80 of the same transistor. The node 104 is also connected to one end of a capacitor 106 while the other end of the capacitor 106 is connected to a common point 108. The gate electrode 76 of the transistor 54 is connected to the gate electrode 84 of the transistor 56. The drain electrode 86 of the transistor 56 is connected to the common point 108. The source electrodes 78 and 84 of the transistors 54 and 56 are connected together and in turn are connected to the negative power supply 102.

The current mirrors 42 and 44 operate on the principal to provide a charging and discharging path for the timing capacitor 12. In order to do this, the direction of the current flow must be opposite from one to the other. However, in order to insure overall accuracy and frequency response of the circuit, the magnitudes of the charging current and discharging current, although opposite, must be of equal and opposite value. This is achieved through a plurality of current mirrors as will be described immediately hereinafter.

The current mirror 42 comprises transistors 110 and 112. The transistor 110 has gate, source and drain electrodes at 114, 116, and 118, respectively. The transistor 112 has gate, source and drain electrodes at 120, 122 and 124, respectively. The gate electrodes 114 and 120 of the transistors 110 and 112 are both connected to the common point 108. The source electrodes 116 and 122 of the transistors 110 and 112 are connected to the negative power supply 102. The drain electrode 124 of transistor 112 is connected to the output terminal 126 of the first current mirror 42. This provides the discharge path for the timing capacitor 12 shown in FIG. 1. In this manner, the current from the capacitor 12 enters by way of terminal 126 and passes through transistor 112 to the negative power supply 102.

The second current mirror comprises a plurality of transistors 130, 132 and 134. The transistor 130 has gate, source and drain terminals at 136, 138 and 140, respectively. The transistor 132 has gate, source and drain terminals shown as 142, 144 and 146, respectively. The transistor 134 has gate, source and drain terminals at 148, 150 and 152, respectively.

The drain electrode 118 of the transistor 110 is connected to the gate terminals 136, 142 and 148 of the transistors 130, 132 and 134, respectively. The drain electrode 118 is also connected to the drain electrode 140 of the transistor 130. The source electrodes 138, 144 and 150 of the transistors 130, 132 and 134 are all connected to the positive voltage supply 100. The drain terminal 152 of the transistor 134 comprises the charging path by way of output terminal 154 for the timing capacitor 12 shown in FIG. 1. The drain electrode 146 of the transistor 132 is connected to the gate terminal 70 of the transistor 52 as the feedback control voltage for the non-inverting input to the differential amplifier 24. The drain electrode 146 is also connected to one end of a resistor 156 and a first end of a capacitor 158. The second end of the resistor 156 and the second end of the capacitor 158 are both connected to the negative power supply 102.

The operation of the complementary current generator 10 is as follows. The input section, transistors 50 and 52 in a differential amplifier which has the inverting input signal on gate 64 of the transistor 50 and the non-inverting input signal at the gate 70 of the transistor 52. The output signal is at the drain 140 of the transistor 130. Transistor 110 is a level shifter and also a complementary current reference generator. The voltage difference between the non-inverting input at gate 70 and the inverting input at gate 64 relate to the gate voltage 142 of the transistor 132 by the following equation.

$$V_{sg} = V_{DD} - A\,[I_d \cdot R_2 - V_{IN}]$$

where $V_{sg}$ is the source to gate voltage of transistor 132, $I_d$ is the drain current of transistor 132, $A$ is the gain of the differential amplifier. This equation can be written as follows to show the linear relationship between the input voltage and the drain current of transistor 132.

$$I_d = \frac{V_{IN}}{R_2} + \frac{1}{A}(V_{DD} - V_{sg})$$

For a high gain differential amplifier, where $A$ is larger than 100, the last term, $$[A^1 (V_{DD} - V_{sg})]$$

becomes insignificant. Hence, the drain current of transistor 132 is accurately determined by $V_{IN}$ and $R_2$ and linearly proportional to $V_{IN}$. The transistors 130 and 134 are the current mirror of transistor 132, because they have the same source to gate voltage and are operated in the saturation region of the transistor. The same is true for transistors 110 and 112. Therefore, between transistors 134 and 112, a pair of complementary current sources are generated. The capacitors 106 and 158 are added for stability of the circuit.

The bias network comprising the transistor 58 and resistor 62 establish a current flow between the positive voltage source 100 and the negative voltage source 102. The connection of the gate electrode 94 of the transistor 60 to the gate and drain electrodes 88 and 92 of the transistor 58 makes the transistor 60 a current mirror of the transistor 58 for insuring that the current through the drain electrode 98 of the transistor 60 is the same as that flowing through the resistor 62. This insures that the current drain of the operational amplifier is kept at a predetermined low level.

Figure 3A:
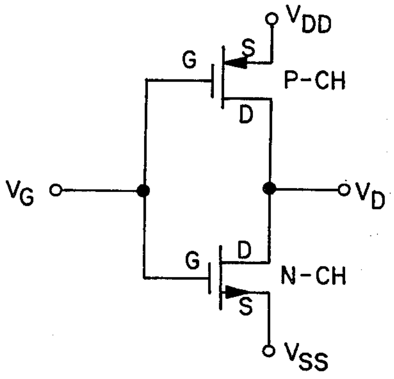
FIG. 3*a* is a circuit diagram of a CMOS pair which is the basic building block for the CMOS oscillator described herein.
Figure 3B:
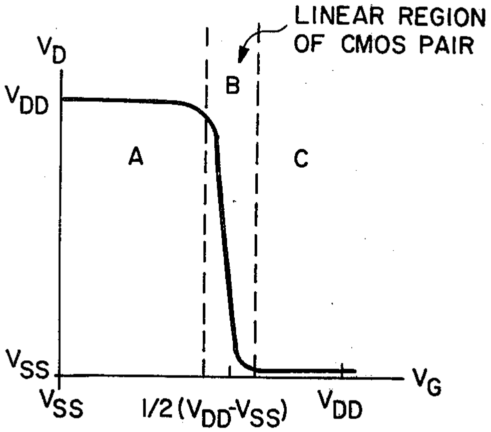
FIG. 3*b* shows the characteristic curve of the CMOS pair shown in FIG. 3*a*.

Referring to FIG. 3*a*, there is shown a CMOS inverter and referring to FIG. 3*b*, there is shown the characteristic curve of the CMOS inverter shown in FIG. 3*a*. If $V_a$ is equal to $V_{DD}$, then the P-channel CMOS device will be turned off and the N-channel CMOS device will be turned on. $V_a$ is then equal to $V_{SS}$. The inverse is true. When $V_a$ is equal to $V_{SS}$, then $V_d$ is equal to $V_{DD}$. As a matter of fact, this switching action is taking place as soon as $V_a$ is larger than one half $(V_{DD}-V_{SS})$, which means that if we properly bias the $V_a$ at around one half $(V_{DD}-V_{SS})$ then this CMOS inverter will act as a small signal inverter amplifier. This CMOS pair has been applied to form three different functions. The first function is that of an inverter to perform wave shaping and as a buffer in generating proper signal polarities. The second function of the CMOS pair is a switch and the third function is an amplifier.

Figure 4:
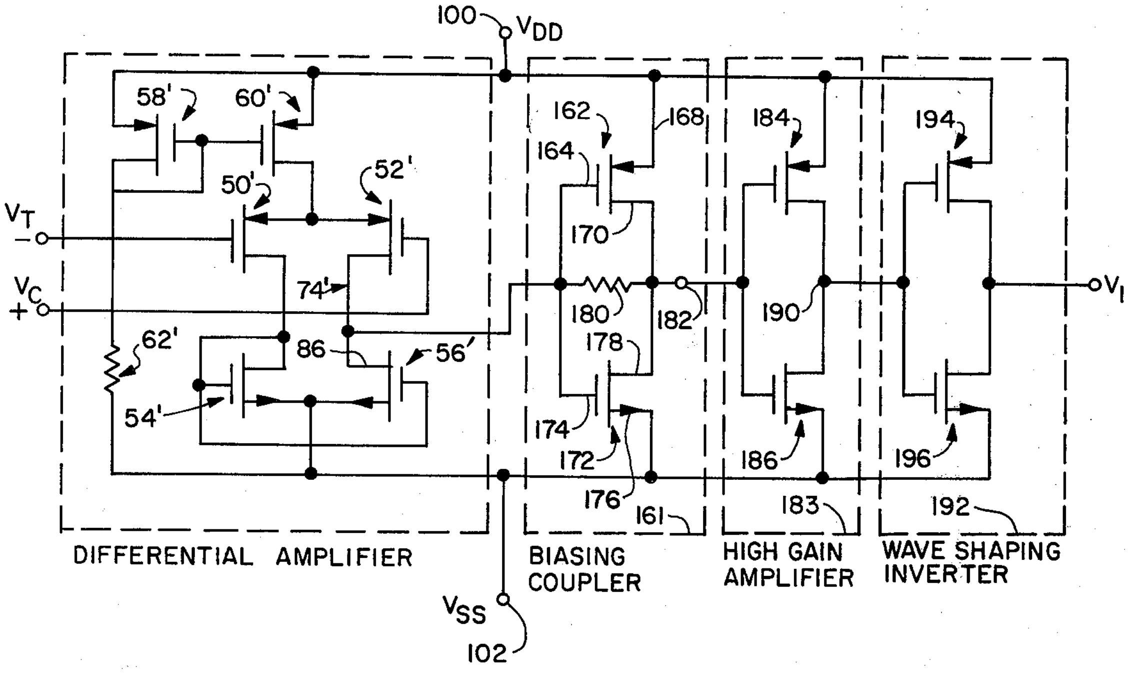
FIG. 4 is a circuit diagram of a voltage comparator used in the CMOS oscillator.

Referring to FIG. 4, there is shown a detailed schematic of the voltage comparator used as an integral part of the present invention. The differential amplifier 160 is substantially identical with the differential amplifier 24 used in the current generator circuit 10 and, hence, the components of this differential amplifier will be given the same identifying numerals except raised to the prime. These components operate in an identical fashion as their comparable components in the differential amplifier 24. The input transistors are 50′ and 52′, the load transistors are the transistors 54′ and 56′ and the bias network comprises the transistors 58′, 60′ and the resistor 62′. The only difference is that the capacitor 106 shown in FIG. 2*a* is deleted from the configuration shown in FIG. 4 as to increase the frequency response of the voltage comparator. The output from the differential stage 160 of the high speed voltage comparator is taken at the common junction of the drains 74′ and 86′ of the transistors 52′ and 56′, respectively. The output is applied to a biasing coupler 161 comprising a pair of transistors similarly configured as that shown in FIG. 3*a*. The biasing coupler comprises a first transistor 152 having gate, source and drain terminals 164, 168 and 170, respectively. A second transistor is shown at 172. This transistor has gate, source and drain terminals 174, 176 and 178, respectively. The gate electrode 164 of the transistor 162 is connected to the gate electrode 174 of the transistor 172 as well as to one end of a resistor 180. The drain electrode 170 of the transistor 162 is connected to the drain electrode 178 of the transistor 172 as well as to one end of a resistor 180. The drain electrode 170 of the transistor 162 is connected to the drain electrode 178 of the transistor 172 as well as to the second end of the resistor 180. The source electrode 168 of the transistor 162 is connected to the positive voltage supply 100. The source electrode 176 of the transistor 172 is connected to the negative power supply 102. The biasing coupler stage operates to provide the correct biasing voltage at its output terminal 182 which forms the input to a high gain amplifier 183 comprising a pair of transistors 184 and 186. These transistors 184 and 186 are connected in an identical way as transistors 162 and 172 and, hence, will not be described in detail. The output from the high gain amplifier is available at the output terminal 190 and is applied as the input to a wave shaping inverter indicated generally at 192. The wave shaping inverter comprises a pair of transistors 194 and 196 which are connected identically as the transistors 184 and 186. The output signal at the drains of the transistors 194 and 196 is identified as the V1 output signal.

Figure 5:
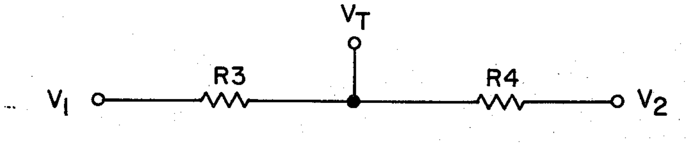
FIG. 5 is a three terminal network used in the CMOS oscillator to form an hysteresis feedback loop for the voltage comparator.
Figure 6:
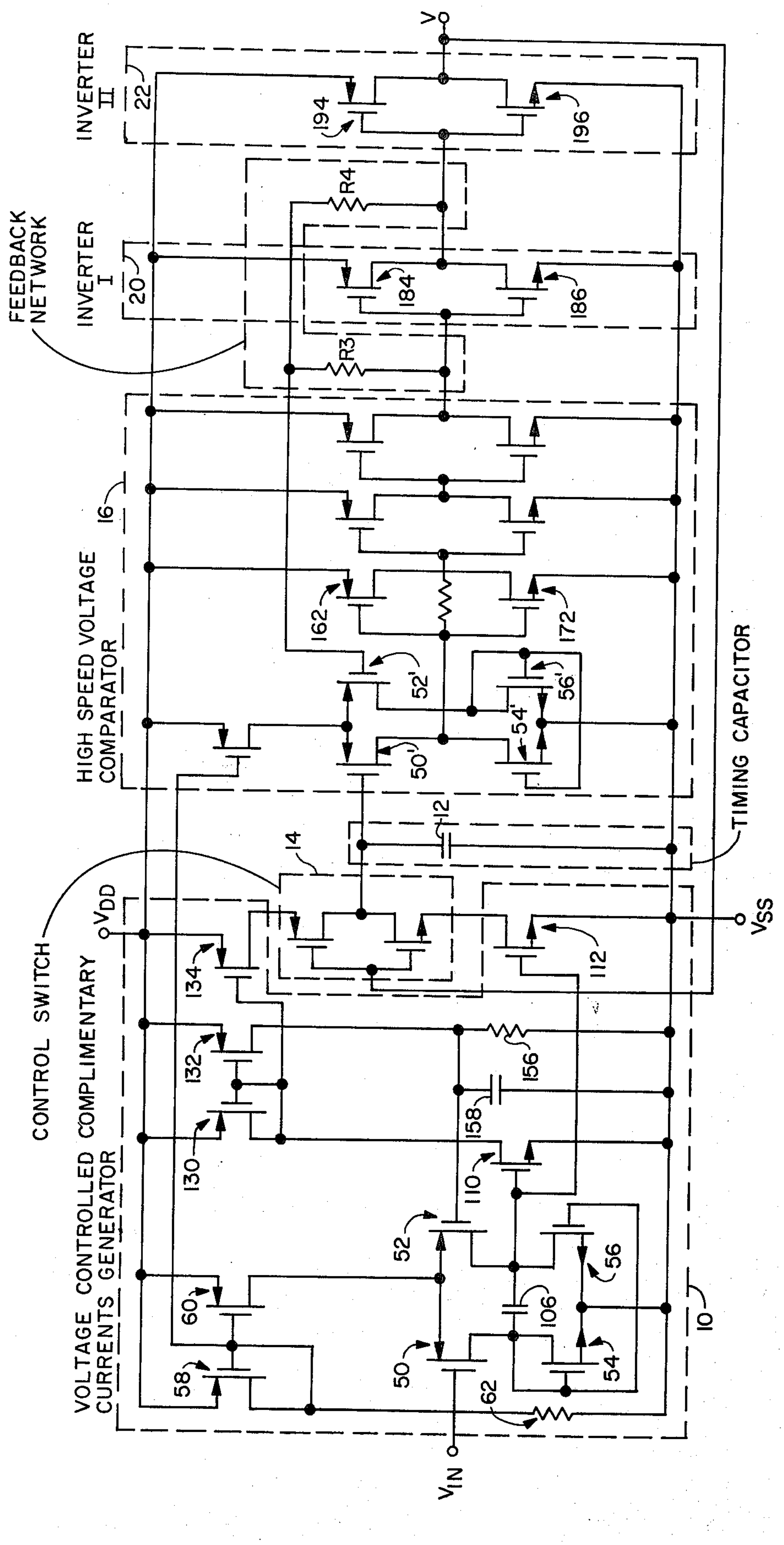
FIG. 6 is a circuit diagram of the CMOS voltage controlled oscillator.
Figure 7:
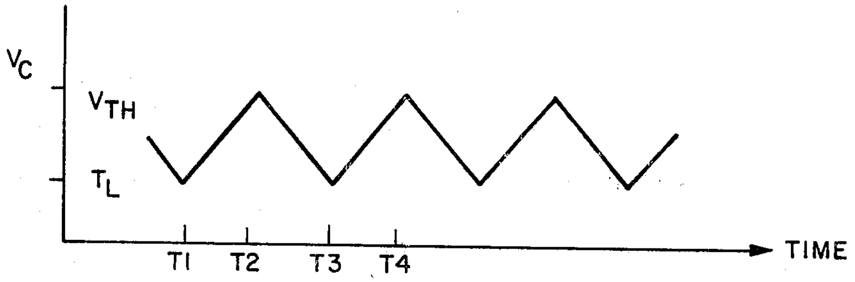
FIG. 7 shows the waveform of the non-inverting input to the voltage comparator used in FIG. 6.
Figure 8:
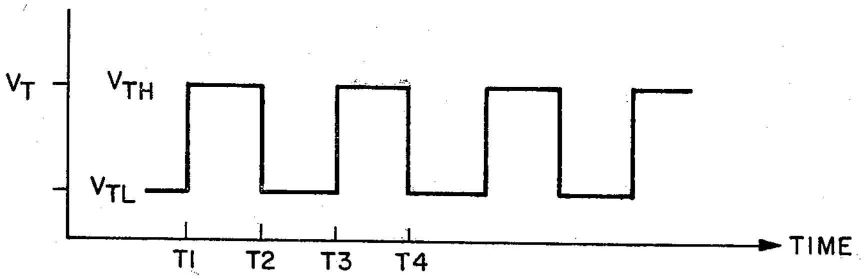
FIG. 8 shows the waveform of the inverting input to the voltage comparator shown in FIG. 6.
Figure 9:
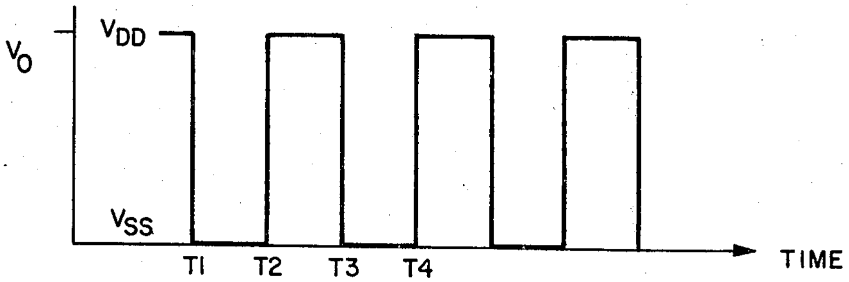
FIG. 9 shows the waveform of the output of the voltage controlled oscillator shown in FIG. 6.

Referring to FIG. 5, there is shown a schematic view of the hysteresis feedback loop utilized in the present invention. The purpose of the hysteresis feedback loop is to provide a threshold signal for the comparator. The threshold signal will trigger the direction of the charging and discharging of the timing capacitor and, hence, fix the overall frequency of the oscillator operation. The waveform, available at the capacitor 12 shown on FIG. 6, is shown in FIG. 7. The waveform $V_C$ forms one input to the high speed comparator 160 shown in FIG. 6. The waveform $V_T$ shown in FIG. 8 forms the other input signal to the high speed comparator 160. The threshold voltages $V_T$ are a high threshold voltage and a low threshold voltage. These threshold voltages operate within the range of the positive power supply and the negative power supply. These threshold voltages operate over a smaller range as indicated by the outer limits of the negative power supply and the positive power supply. The lower threshold signal is more positive than the negative power supply while the positive threshold signal is more negative than the positive power supply. However, the function of hysteresis feedback loop is to provide control signals to one input of the comparator. The output signal $V_o$ is shown in FIG. 9.

Referring to FIG. 6, there is shown an overall schematic diagram of the CMOS voltage controlled oscillator. The complementary current source generator 10 is providing a charging current and a discharging current to the capacitor 12 under control of the switch 14. The switch receives enabling and disabling signals from the output signal $V_o$.

The signal $V_C$ on the capacitor 12 forms one input to a voltage comparator 160 while the feedback signal $V_T$ forms the second signal to the voltage comparator. A bias coupler circuit 161 insures that the voltage comparator stage 183 is properly biased to operate in the linear region. The output from the voltage comparator is applied to the output inverters 192.

While there has been shown and described and pointed out the fundamental novel features of the invention as applied to the preferred and other embodiments, it will be understood that various omissions and substitutions and changes in the form and details of the structural element may be made by those skilled in the art without departing from the spirit of the invention.

What is claimed is:

1. A voltage controlled oscillator of the type generating an output signal which is linearly proportional to the voltage level of an input signal, comprising:

capacitor storage means for storing and discharging a charge at a rate proportional to the voltage level of the input signal;

current source generator means responsive to the applied input signal for generating a charging current and a discharging current, said charging current being equal in magnitude and opposite in direction to said discharging current, and said charging current and said discharging current being linearly proportional to the value of the input signal;

switching means intermediate said generator and said capacitor for controlling the flow of charge into and out of said capacitor;

voltage comparator means having a first input signal and a second input signal and being employed for generating a square wave output signal, and said output signal switching to a high state whenever said first input signal exceeds said second input signal;

said first input signal being the signal stored on said capacitor; and feedback means responsive to the output of said comparator for generating said second input signal to said comparator means.

2. A voltage controlled oscillator as recited in claim 1 wherein said comparator further includes:

high gain amplifier means for amplifying the output signal from said comparator; and biasing coupler means intermediate said comparator and said amplifier for biasing said amplifier in its linear amplification region.

3. A voltage controlled oscillator as recited in claim 2, wherein said bias coupler comprises:

a voltage source having a first voltage level and a second voltage level, said first voltage level being more negative than said second voltage level;

a P-channel device having source, drain and gate electrodes;

an N-channel device having source, drain and gate electrodes;

a resistor having a first end and a second end;

said source electrode of each device being connected to different ones of said voltage level;

said gate electrode of each device being connected together and that junction being connected to one end of said resistor;

said drain electrode of each device being connected together and that junction being connected to said second end of said resistor; and said resistor being employed for keeping said P-channel device and said N-channel device operating in their linear amplification range.

4. A voltage controlled oscillator as recited in claim 1, wherein said generator further comprises:

a differential amplifier responsive to said input signal for generating a first polarity output signal and for generating a second polarity output signal;

a first current mirror responsive to said first polarity output signal for generating a charging current for said capacitor; and a second current mirror responsive to said second polarity output signal for generating a discharging current for said capacitor.

* * * * *